United States Patent [19]
Runyon et al.

[11] Patent Number: 5,101,975
[45] Date of Patent: Apr. 7, 1992

[54] ELECTRONIC COMPONENT CARRIER

[75] Inventors: John F. Runyon, St. Paul; Ted. T. Christianson, Bloomington, both of Minn.

[73] Assignee: Novapak, Inc., St. Paul, Minn.

[21] Appl. No.: 640,656

[22] Filed: Jan. 18, 1991

Related U.S. Application Data

[63] Continuation-in-part of Ser. No. 607,604, Oct. 31, 1990, Pat. No. 5,046,610, which is a continuation of Ser. No. 471,828, Jan. 29, 1990, abandoned.

[51] Int. Cl.⁵ .............................................. B65D 73/02
[52] U.S. Cl. ................................................... 206/330
[58] Field of Search ................ 206/328, 329, 330, 332

[56] References Cited

U.S. PATENT DOCUMENTS

| | | |
|---|---|---|
| 3,311,229 | 3/1967 | Troll et al. |
| 3,315,637 | 4/1967 | Taylor |
| 3,415,361 | 12/1968 | Adams, Jr. et al. |
| 3,444,993 | 5/1969 | Lunsford |
| 3,465,874 | 9/1969 | Hugle et al. |
| 3,505,725 | 4/1970 | Curry |
| 3,523,608 | 8/1970 | Miller |
| 3,650,430 | 3/1972 | Siegmar et al. |
| 3,893,212 | 7/1975 | Curry |
| 3,894,895 | 7/1975 | Watanabe |
| 3,921,788 | 11/1975 | Roberson, Jr. et al. |
| 3,999,258 | 12/1976 | Curry |
| 4,178,113 | 12/1979 | Beaver et al. |
| 4,200,191 | 4/1980 | Nakamura et al. |
| 4,298,120 | 11/1984 | Kaneko et al. |
| 4,619,573 | 10/1986 | Rathman et al. |
| 4,740,136 | 4/1988 | Asai et al. |
| 4,849,857 | 7/1989 | Butt et al. |
| 4,852,737 | 8/1989 | Noll |

FOREIGN PATENT DOCUMENTS

| | | |
|---|---|---|
| 0276539 | 8/1988 | European Pat. Off. |
| 0358063 | 3/1990 | European Pat. Off. |

OTHER PUBLICATIONS

Plastronics Inc., catalog entitled, "Burr In Products Descriptions and Specifications", 8 pp., dated 1988 (Exhibit A).
Plastronics Inc., catalog entitled, "Burn-In QEP Carriers/Sockets", 4 pgs., dated 1988, (Exhibit B).
Two-page document entitled, "Embossed Carrier Dimensions", (Exhibit C) (no date available).
Four-page document from Yamaichi, (Exhibit D) (no date available).
Four-photographs showing a Mitsubishi product for handling electronic components, (Exhibit E) (no date available).

*Primary Examiner*—William I. Price
*Attorney, Agent, or Firm*—Merchant, Gould, Smith, Edell, Welter & Schmidt

[57] ABSTRACT

A carrier having a carrier body to handle and protect electronic components which have a body portion. The carrier body having a bottom member with a flat upper surface portion with a smaller component supporting surface. The bottom member also having locator ridges which surround the component supporting surfaces. The carrier body also having a restraint structure which extends over at least a part of the component supporting surface. The restraint structure releasing a component individually from a single carrier or simultaneously or successively from all carriers when components are transferred in bulk. The body portion of the component restrained during handling within the area defined by the component supporting surface, the locator ridges, and the restraint structure.

31 Claims, 8 Drawing Sheets

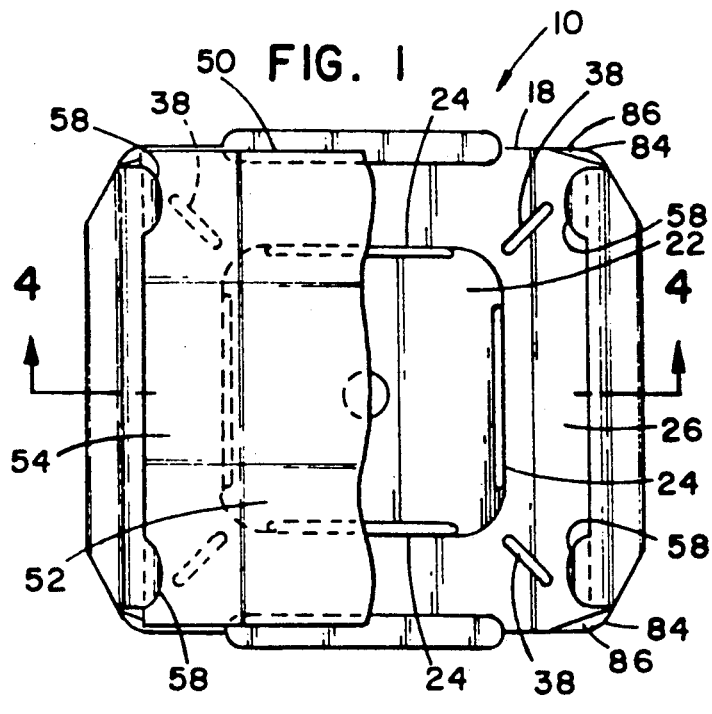
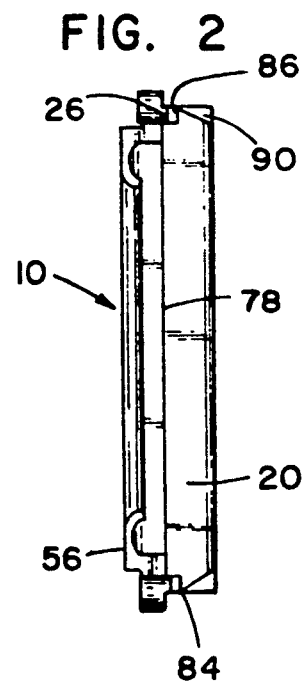
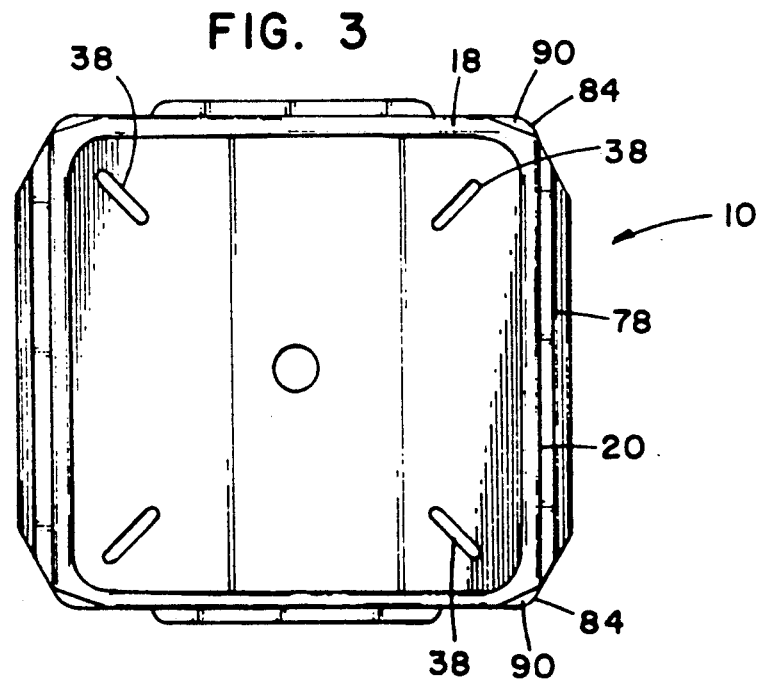
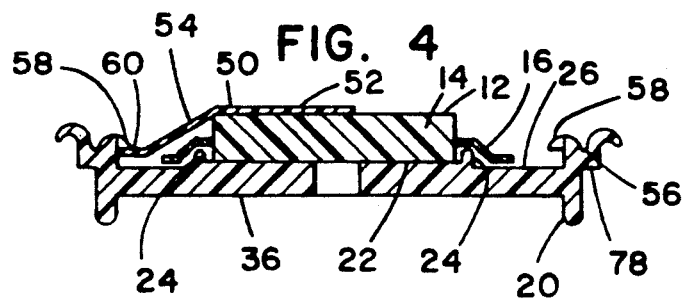

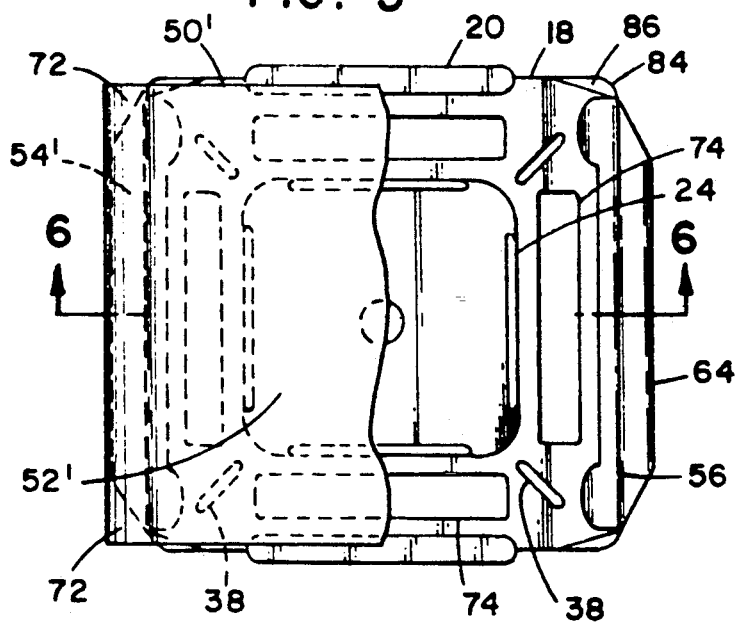
FIG. 5
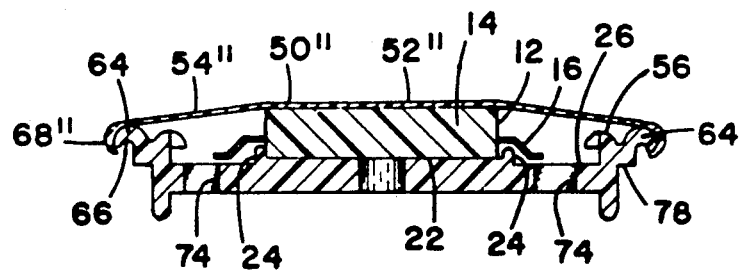
FIG. 6
FIG. 7
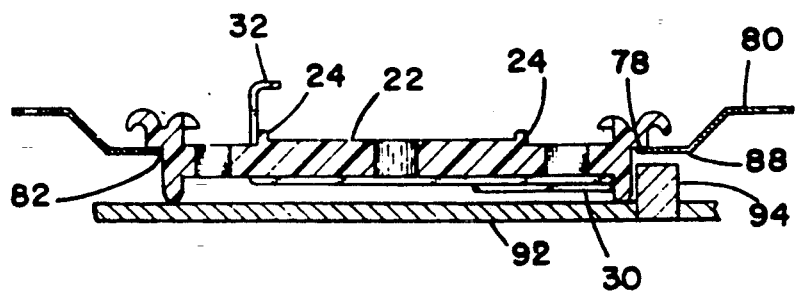
FIG. 12

ELECTRONIC COMPONENT CARRIER

This application is a continuation-in-part of Ser. No. 07/607,604, filed Oct. 31, 1990, now U.S. Pat. No. 5,046,610 which is a continuation of Ser. No. 07/471,828, filed Jan. 29, 1990, now abandoned.

TECHNICAL FIELD

This invention relates generally to the field of carriers for carrying objects, and particularly to carriers for carrying electronic components.

BACKGROUND OF THE INVENTION

Many electronic components have a body with metal leads extending from the body. These leads are often numerous, quite small, and very fragile. Within the body of the component, there may also be fragile parts. As a result, the components can be easily damaged during handling from the time of manufacture of the component until the time of installation of the component into a circuit. Damage to the component can occur in several ways. The leads can be damaged through contact with a contaminating substance. They can be damaged through corrosion of the lead material. They can also be damaged if the leads become bent. The component can be ruined if it is not protected from electrical energy exceeding the design limits that commonly exists during handling. Since electronic components can be expensive, damage prevention during handling is often a major concern in the electronics industry.

Prior methods of bulk handling electronic components include inserting the components into tubes. The components are slid into a tube which completely surrounds the component. Handling of the components is accomplished by handling the tubes. Before installing the component into the circuit, the components must be slid back out from the tube. Another method is to attach the components to a flexible tape and then handling the tape. Before installing the component, the component must be detached from the tape. A third method is to place each component on a tray and then handling the tray. Because this method often relies on gravity to keep the component in the tray, care must be taken to prevent the component from being knocked out during handling of the tray. Sometimes these trays have features for mounting the component to the tray. However, these features are often not easily employed and may come in contact with the leads. Not only do all these methods expose the component and its leads to excessive damage during handling, they also do not allow for easy handling of the components individually or in bulk.

The present invention allows the component to be easily handled from the point of manufacture of the component to the point of installation of the component into the circuit while at the same time protecting the component and its fragile leads from damage. During the handling process of the component, the component can be easily placed into, maintained within, and removed from the carrier without exposing the component to excessive damage. The carrier itself can be easily handled either individually or in bulk. These and other advantages of the present invention over the prior art will become more apparent after reading the description and claims which follow.

SUMMARY OF THE INVENTION

This invention is a carrier for use in handling and protecting electronic components which have a body portion and, in some cases, extending leads. The bottom of the carrier has a flat upper surface with a smaller component supporting surface for supporting the component. Surrounding the component supporting surface are locator ribs. The carrier has a restraining structure which extends over at least part of the component supporting surface. During handling, the body portion of the component is restrained within the area defined by the component supporting surface, the locator ribs, and the restraining structure.

BRIEF DESCRIPTION OF THE DRAWINGS

FIG. 1 is a top view of a first preferred embodiment of the carrier showing the cover partially cut away.

FIG. 2 is a side view of the carrier shown in FIG. 1 without the cover.

FIG. 3 is a bottom view of the carrier shown in FIG. 1 without the cover.

FIG. 4 is a cross-sectional side view of the carrier shown in FIG. 1 showing a component in the carrier.

FIG. 5 is a top view of a second preferred embodiment of the carrier showing the cover partially cut away.

FIG. 6 is a cross-sectional side view of the carrier shown in FIG. 5 showing a component in the carrier.

FIG. 7 is a cross-sectional side view of a third preferred embodiment of the carrier showing a component in the carrier.

FIG. 12 is a cross-sectional side view of the carrier sheet and the carriers shown in FIG. 11 without the covers but having a spring latch and showing a latching plate below the carrier with a perpendicular latching post.

DETAILED DESCRIPTION OF THE PREFERRED EMBODIMENTS

Figure 8:
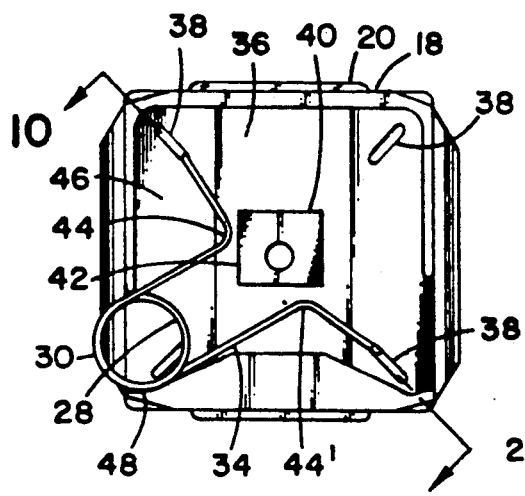
FIG. 8 is a bottom view of a fourth preferred embodiment of the carrier showing the spring latch in the component restrained position.

Throughout the following description, reference will be made to the drawings and the same numerals will be used throughout several views to indicate the same or like parts of the invention.

Referring now to FIGS. 1-4 showing a first preferred embodiment, the carrier 10 has a carrier body 18 which has a bottom member 20 with a flat upper surface portion 26. The flat upper surface portion has a smaller component supporting surface 22. A plurality of locator ribs 24 surround the component supporting surface. These ribs extend upward from the bottom member. FIG. 1 shows a first preferred embodiment of the carrier body having a cover 50 which extends over the component supporting surface. As best shown in FIGS. 2 and 4, the carrier body 8 has side members 56 which extend upward from the upper surface portion of the bottom member and further surround the upper surface portion 26. The side members have cover tabs 58 extending parallel to and toward the component supporting surface. The cover tabs each have a lower cover tab surface portion 60 facing downward. The cover has a cover edge portion 54. The cover edge portion engages the lower cover tab surface portions of the cover tabs which are located on side members positioned on opposite sides of the bottom member to restrain the cover from upward movement.

FIG. 2 and FIG. 3 show the side and the bottom of the carrier body without the cover. The bottom member 20 and the side members 56 of the carrier body are rigid structures and can be made of conductive, high temperature plastic.

The cover 50 is made of a resilient material and can be made from die cut plastic or thin aluminum. The resilient properties of the cover shown in FIG. 1 biases the cover edge portion 54 outward so that the cover edge portion remains below the lower cover tab surface portion 60. The cover center portion 52 of the cover is higher than the cover edge portion, as shown in FIG. 4. Opposing forces applied to the cover edge portion acting parallel to the component supporting surface will cause the cover center portion to bow upwards away from the component supporting surface. Because the cover center portion bows upward as the forces are applied, the cover edge portion moves inward allowing the cover to be mounted to the carrier side members by lowering the cover while the forces are being applied. After the forces are removed, the cover edge portion is biased back to its original outward location with a portion below the lower cover tab surface portions 60 of the cover tabs 58. To remove the cover, forces are applied to move the cover edge portion inward again and then the cover is lifted upward.

FIG. 4 shows the carrier body with an electronic surface mount component 12 having a body portion 14 restrained in an area defined by the component supporting surface 22, the locator ribs 24, and the cover center portion 52. In this position, the component body portion and the fragile extending leads 16 are protected from damage during handling. Furthermore, during mounting and dismounting of the cover 50, the cover never contacts the leads of the component. The locator ribs are positioned on the carrier body bottom member to locate a specific component body portion. The carrier body shown in FIGS. 1-4 is designed to a hold a Plastic Quad Flat Pack electronic component (not shown). Improper positioning of the locator ribs, such as positioning the ribs too close together, can result in the component not fitting properly into the carrier body. Further, the component will not be sufficiently restrained from horizontal movement during handling if the ribs are too far apart.

Figure 11:
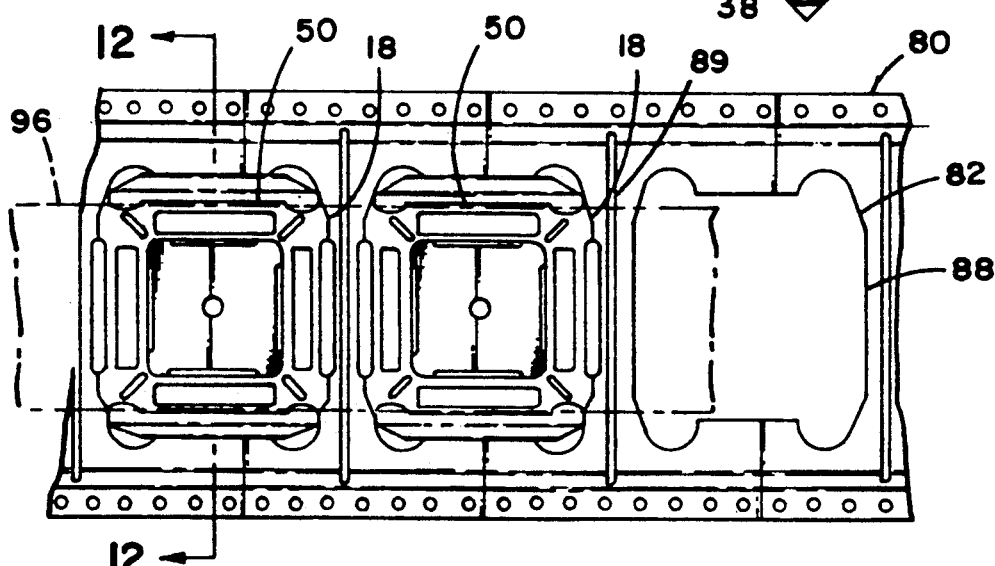
FIG. 11 is a top view of a carrier sheet and two carriers shown with a continuous tape made of individual covers joined together.

FIGS. 1 and 4 show the carrier with a single cover. In bulk handling situations where several carriers have fixed positions adjacent to each other in a line, several covers may be joined together in a single continuous cover tape. FIG. 11 shows multiple carriers fixed in a line. FIG. 11 also shows multiple covers 50 joined together in a continuous cover tape 96 shown by dashed lines. The cover tape would have the same cross-sectional area throughout as the single cover shown in FIG. 4. The cover tape can be mounted to and removed from multiple carriers arranged in a line either simultaneously or successively by the application of opposing forces acting parallel to the component supporting surfaces of the carriers.

FIGS. 5 and 6 show a second preferred embodiment of the invention. The carrier body side members 56 on opposite sides of the bottom member each have a gripper rail 64. The gripper rails each have a lower rail surface portion 66 extending outward from the side members 56. The gripper cover 50' has a curled portion 68 along the gripper cover edge portion 54'. The curled portion surrounds the gripper rails and engages the lower rail surface portions of the gripper rails to restrain the cover from upward movement. As shown in FIGS. 1-6, the carrier body side members can simultaneously have gripper rails 64 and cover tabs 58 to allow for the different covers to be used interchangeably with the carrier body.

The gripper cover 50' is designed with a rigid but resilient material. The cover center portion 52' biases the gripper cover edge portion 54' upward when the gripper cover edge portion is bent downwards. By bending the sides of the gripper cover 50' not having the curled portions upward, the curled portions 68 on each side of the gripper cover 50' will open to snap over the gripper rails 64 to mount the gripper cover to the carrier body 18. When the curled portion snaps over the gripper rail, the cover center portion resists the bending moments produced as the gripper cover edge portion is held down by the curled portion 68 engaging the lower rail surface portion 66 of the gripper rail 64. This helps maintain contact between the gripper cover edge portion and the gripper rails to restrain the gripper cover from upward movement. To remove the gripper cover 50', the curled portion spreads outward as the gripper cover is bent upward along the sides not having the curled portions. Because the curled portions spread open as the gripper cover is bent upward along the sides not having the curled portions, the gripper cover engages and disengages from the gripper rails without having to awkwardly pry the curled portions outward away from the gripper rails.

FIGS. 5 and 6 show a carrier with a single gripper cover 50'. In bulk handling situations where several carriers have fixed positions adjacent to each other in a line, several gripper covers may be joined together in a single continuous cover tape. FIG. 11 shows multiple carriers fixed in a line. While FIG. 11 shows multiple covers 50 joined together in a continuous cover tape 96, multiple gripper covers 50' would be joined together in a similar tape having gripper cover edge portions 54' instead of cover edge portions 54. The cover tape would have the same cross-sectional area throughout as the single gripper cover shown in FIG. 6. To mount the gripper covers of the cover tape to each carrier, each gripper cover is snapped simultaneously or successively over the gripper rails of each carrier in the series. Similarly, to remove the gripper covers from the carriers, the cover tape would be bent simultaneously or successively upward from each carrier in the series.

The gripper cover 50' also has a gripping portion 72 extending beyond the gripper rail 64 as shown in FIG. 5. The gripping portion provides a gripping surface for easy removal of the gripper cover from the gripper rails by peeling away the gripper cover.

FIG. 6 shows the carrier body with gripper cover 50' restraining the component body portion 14 in an area defined by the component supporting surface 22, the locator ribs 24, and the gripper cover center portion 52'. In this position the component body and the extending leads 16 are protected from damage during handling. Furthermore, during mounting and dismounting of the gripper cover 50', the gripper cover never contacts the leads of the component.

FIG. 7 shows a third preferred embodiment of the invention. The modified gripper cover 50" has a modified gripper cover center portion 52" which is maintained in tension. As shown in FIG. 7, portions of the component body portion extend above a plane defined by the tops of the gripper rails 64. The modified gripper cover center portion is made of a thin flexible material which resiliently stretches across the component top surface in contact with it. Tension is developed to restrain the component in the carrier body. The modified curled portion 68" grips the lower rail surface portions 66 of each gripper rail 64 to maintain tension, restraining the modified gripper cover from upward movement. The component body portion 14 is restrained in the area defined by the component supporting surface 22, the locator ribs 24, and the modified gripper cover center portion 52". In this position, the component body and the extending leads 16 are protected from damage during handling. Furthermore, during mounting and dismounting of the modified gripper cover 50", the modified gripper cover never contacts the leads of the component.

Like covers 50 and gripper covers 50', the modified gripper covers 50" can also be joined together in a continuous cover tape as shown in FIG. 11 for the covers 50. This cover tape would also be mountable either successively or simultaneously to the carriers fixed in a line during bulk handling.

As shown in FIGS. 4, 6, and 7, the cover 50, the gripper cover 50', and the modified gripper cover 50" are designed so that the center portions contact the component body portion 14 as the component rests on the component supporting surface 22 while the component is restrained. This contact produces a downward force acting to restrain the component from any upward movement. Creep may occur in the cover material because of storage time or temperature, reducing the hold down force of the cover on the component to zero. However, the covers remain in contact with the component body and mounted to the carrier body side members 56 so that as soon as the component body pushes up against the covers, the covers will resist with downward force on the component body. Because the carrier body restrains the covers from upward movement, it is not necessary that the covers even be designed to initially maintain a hold down force on the component. They must merely be designed to not allow the component body portion to leave the area between the component supporting surface 22, the locator ribs 24, and the cover center portion 52, the gripper cover center portion 52', or the modified gripper cover center portion 52" depending upon which embodiment is employed.

Figure 10:
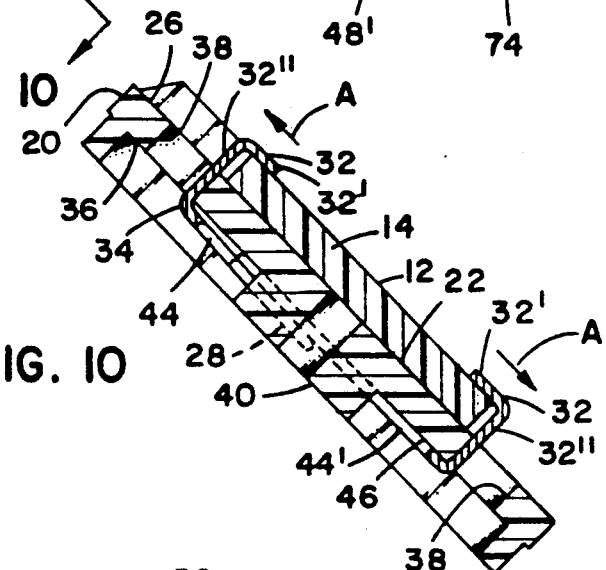
FIG. 10 is a cross-sectional side view of the carrier shown in FIG. 8 showing the spring latch in the component retrained position with a component in the carrier.

A fourth preferred embodiment of the invention is shown in FIGS. 8 and 10. The carrier body has a spring latch 30 which has L-shaped latch tips 32 as is best shown in FIG. 10. The latch tips have top portions 32' extending generally parallel to and over a portion of the component supporting surface 22 and side portions 32" extending generally perpendicular to and outside of the component supporting surface. The latch tips are moveable between two positions, one where the top portions extend over the component supporting surface, called the component restrained position, and a second where they are pulled away from and parallel to the component supporting surface, called the component unrestrained position. The direction of movement of the latch tips from position one to position two is shown by arrow A in FIG. 10. The latch tips are connected by a latch actuator 34. The latch actuator has a spring portion 28 that resiliently biases the latch tips to the first position, or component restrained position. The spring portion shown in FIG. 8 is a torsion coil spring. A portion of the spring portion extends beyond the perimeter of the bottom member when the spring latch is in the component restrained position as shown in FIG. 8. The latch actuator also has V-shaped actuator arms 44 and 44' parallel to the component supporting surface and connecting the latch tips to the ends of the spring portion. Movement of these actuator arms causes movement of the latch tips. The spring latch can be bent from a one-piece, low-cost wire, making the spring latch easy and inexpensive to manufacture.

The bottom member 20 of the carrier body has an actuator cavity 36 which lies below the upper surface portion 26 as seen in FIG. 10. Spring latch guide slots 38 extend upward from the actuator cavity to the upper surface portion. These guide slots are located near opposite corners of the upper surface portion 26 outside the locator ribs 24 and inside the side members 56. The location of these guide slots on the upper surface portion 26 are best shown in FIG. 1, although FIG. 1 illustrates the first preferred embodiment employing a cover 50 as the component restraining structure. The slots are positioned so that when the latch tips are in the component restrained position, the top portions 32' of the latch tips extend over at least a portion of the component supporting surface 22. When the latch tips move toward the component unrestrained position, the guide slots allow the top portions 32' of the latch tips to be pushed away from the component supporting surface. The guide slots are elongate shaped and are sufficiently wide to allow the latch tips to slide easily between the component restrained and unrestrained positions. The guide slots also function as a guide to help guide the spring latch during movement of the latch tips. The spring latch tips 32 are inserted upward through these guide slots. The latch actuator 34 remains below in the actuator cavity 36. The spring latch is restrained from upward movement by the actuator arms 44 and 44' engaging the upper surface 46 of the actuator cavity.

FIG. 10 shows a cross-sectional view of the latch tips 32 restraining a component body portion 14 within the area defined by the component supporting surface 22, the locator ribs 24 (not shown), and the top portions 32' of the latch tips 32. The latch tips can be designed to engage the component body portion while the body portion rests on the component supporting surface. However, the spring latch will restrain the component adequately if the latch tips are slightly higher but not so high as to permit the component body portion to rise higher than the ribs, thus leaving the area defined by the component supporting surface, the locator ribs, and the latch tips. To release the component from the restraint area, the latch tips are forced apart by moving the latch arms apart. When the tips are in the component unrestrained position, the component body portion 14 is no longer restrained from upward movement by the latch tips and the component can be lifted from the carrier.

The actuator cavity 36 has a latch actuating ramp 40 which extends downward from the actuator cavity upper surface 46. The carrier body can be designed so that the latch actuating ramp is an integral part of the carrier body or it can be a separate piece which snaps into the actuator cavity upper surface. The latch actuating ramp has a ramp surface 42 which slidably engages the actuator arm 44 to guide the spring latch as it moves the tips toward and away from the component supporting surface. Latch arm 44' does not engage the latch actuating ramp and merely functions as a link between the spring portion and the latch tip. When the actuator arm 44 is pushed against the ramp surface by an external force applied to the latch actuator, the latch tips move apart. The spring latch, the latch actuating ramp and the guide slots together produce equal spread of the latch tips despite input to the latch actuator that is not symmetrical. Additional guide surfaces 48 can also be provided to help guide the spring latch and produce equal latch tip spread as the actuator arm is forced against the latch actuating ramp.

The latch actuating ramp 40 can be ,employed to move the latch tips 32 away from the component supporting surface 22 by simply moving the carrier past a latching post 94 as shown in FIG. 12 which has a surface for slidably engaging the spring latch to force the latch arm 44 against the ramp surface 42 to cause movement of the latch tips 32 from the component restrained position to the component unrestrained position. The latching plate 92 serves as a mount for the perpendicular latching post. As shown in FIG. 8, the spring portion 28 extends slightly beyond the perimeter of the carrier bottom member 20. The latching post is slid along the side of the carrier body 18 to engage the part of the spring portion protruding beyond the bottom member causing actuation of the spring latch and movement of the latch tips. Actuation can also occur by moving the carrier while the latching post is fixed. The carrier sheet shown in FIG. 11, for example, may be transported past a stationary post which deflects the spring latch of each carrier as they pass the post to cause each spring latch to successively move the latch tips of each carrier to the component restrained position. When the carriers are bulk handled, simultaneous actuation to release many components can be accomplished with multiple posts attached one per carrier to a latching plate located beneath the carriers. The plate may have the deflection posts in a single row or arranged in a grid pattern depending upon how the carriers are bulk handed.

Figure 9:
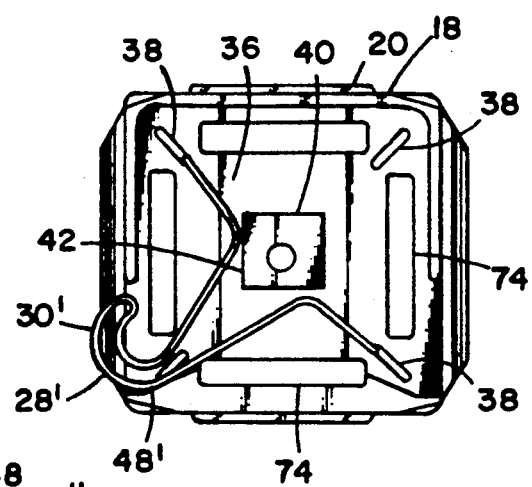
FIG. 9 is a bottom view of a fifth preferred embodiment of the carrier showing a modified spring latch in the component restrained position.

As shown in FIGS. 5, 6, and 9, test access slots 74 are provided to allow the component to be electrically tested without removing the component from the carrier body. This feature helps reduce the likelihood of damage to the component because the component can be placed in a carrier at the point of its manufacture and can remain there until the time to place the component into a circuit. FIG. 9 shows a fifth preferred embodiment having a modified spring latch 30' that is used when the carrier body has the test access slots. The modified spring latch has a modified spring portion 28' formed to avoid interference with the test access slots yet still bias the latch tips to the component restrained position. The test access slots permit a test probe to be inserted into the carrier from below. If the test probe enters from above the component, an insulated backing bar can instead be inserted up through the slots to support the leads during testing.

The fourth and fifth embodiments shown in FIGS. 8–10 only show one spring latch 30 and 30'. In some circumstances it may be useful to provide a second spring latch to restrain the component. A second spring latch can be added after the first one is in place by inserting the latch tips of the second spring latch up through the other two guide slots not being used. The spring portion of the second spring latch would lie in a mirror image location on the opposite side of the bottom member and would similarly extend slightly past the bottom member.

FIG. 11 shows the carrier body employed for bulk handling in a single row carrier sheet 80. The carrier sheets are made of thin material and have mounting openings 82 cut out in the shape of the perimeter of the bottom member of the carrier. The openings have additional rounded corner cut outs to reduce problems caused by sharp internal corners of openings cut exactly to the shape of the perimeter of the carrier bottom member. Bulk handling carrier sheets can have openings cut in single rows as in FIG. 11 or in cut grid patterns (not shown). The carrier sheets are sufficiently rigid to maintain a generally flat shape. Alternatively, the carrier sheets can be made flexible enough to allow the sheet to be wound around a spool during bulk handling of the carriers. In that case, the mounting openings can be cut with sufficient spacing to avoid buckling of the carrier sheet between the carriers as the sheet is wound around the spool or the carrier sheet can have slits 89 shown in FIG. 11 cut between the mounting openings in the sheet to avoid buckling of the carrier sheet.

FIG. 12 is a cross-sectional side view of the carrier body 18 and the carrier sheet 80 shown in FIG. 11. As discussed earlier, FIG. 12 also illustrates the position of the latching plate 92 and the latching post 94 which are only employed with the spring latch to cause actuation of the spring latch. The carrier sheet 80 has a trough-shaped cross-sectional area as shown in FIG. 12. The trough is sufficiently deep such that when the carrier body has a component 14 (not shown in FIG. 12) restrained in the body, a plane formed by the top of the carrier sheet would not contact the spring latch or the cover.

As shown in FIGS. 4, 6, 7, and 12, the bottom member 20 of the carrier body 18 includes a stop seat 78 extending parallel to and away from the bottom member and extending beyond the perimeter of the opening in the carrier sheet. The stop seat supports the carrier on the carrier sheet during handling by engaging the carrier sheet edge 88 as the bottom member is lowered into the opening in the carrier sheet.

The bottom member 20 also includes a plurality of body tabs 84 as shown in FIGS. 1, 2, 3 and 5. The body tabs have a generally flat upper body tab surface portion 86 lying in a plane parallel to and below the stop seat 78 as shown in FIG. 2. The upper body tab surface also extends beyond the perimeter of the mounting opening 82 in the carrier sheet and is engagable with the carrier sheet edge 88 so as to restrain the carrier body from upward movement away from the carrier sheet after the carrier body is inserted into the mounting opening 82. The interaction of the body tabs 84 and the stop seat 78 locks the carrier body to the carrier sheet during handling. As shown in FIGS. 1 and 3, the upper body tab surface is not directly below the stop seat, allowing the carrier body to be manufactured without difficult to manufacture mold undercuts. The body tab also includes an inclined side surface portion 90 as shown in FIG. 3. The inclined side surface portion extends downward and toward the bottom member. The inclined side surface portion deflects the carrier sheet outward away from the bottom member as the carrier is lowered into the mounting opening until the carrier sheet edge flexes back to lie between the upper body tab surface of the body tab and the stop seat.

As described above, the component body portion can be restrained in the carrier body in the area defined by the component supporting surface, the locator ribs, and either the cover center portion of the cover or the latch tips of the spring latch. However, it may also be desirable in some instances to employ both a cover and a spring latch to restrain and protect the component during handling. The preferred embodiments 1 through 5 only illustrate either a cover or a spring latch. If both a spring latch and a cover are simultaneously employed, neither will interfere with the other during handling of the component if the covers are modified slightly to include holes or blisters to avoid interference with the latch tips.

In some circumstances, it may also be desirable to employ a carrier body with a cover that only restricts the component in the area in the carrier body formed by the bottom member, the side members and the cover, eliminating the need for the locator ribs. In that case, the component would bounce around in the carrier body but not leave the carrier body. This would only be the case, however, if the component could withstand that type of handling without damage.

Further improvements and modifications have been made to the embodiments of the component carrier system disclosed in detail above and illustrated in FIGS. 1–12. FIGS. 13–26 illustrate several additional embodiments of the component carrier system in accordance with the principles of the present invention.

Referring now to FIGS. 13–16, a sixth preferred embodiment of a carrier 110 is shown. The carrier 110 has a carrier body 118 which has a bottom member 120 with a flat upper surface portion 126. The flat upper surface portion has a smaller component supporting surface 122. A plurality of locator ribs, or ridges 124, are connected to surround the component supporting surface. These ridges 124 extend upward from the bottom member 120. In the carrier 110 in FIGS. 13–16, the locator ridges 124 connect to completely surround the component supporting surface 122. However, it is to be appreciated that a plurality of separate locator ridges 124 could be provided as long as a portion of the component supporting surface 122 was surrounded by the locator ridges 124 in order to properly restrain the component within the carrier body 118 in the manner discussed previously for the embodiments described previously and shown in FIGS. 1–2 and shown in FIGS. 13–26 and described below. Separate locator ridges, or locator ribs 24, were provided in previous embodiments shown in FIGS. 1–12.

Restraint structure is provided with carrier 110 to cooperate with the component supporting surface 122 and locator ridges 124 to restrain a component in the carrier body 118. As will be discussed in greater detail, the carrier may employ spring latch type structure and/or cover tape type structure to restrain the component.

Figure 14:
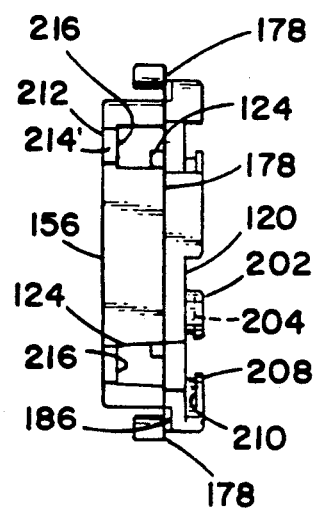
FIG. 14 is a side view of the carrier shown in FIG. 13.
Figure 16:
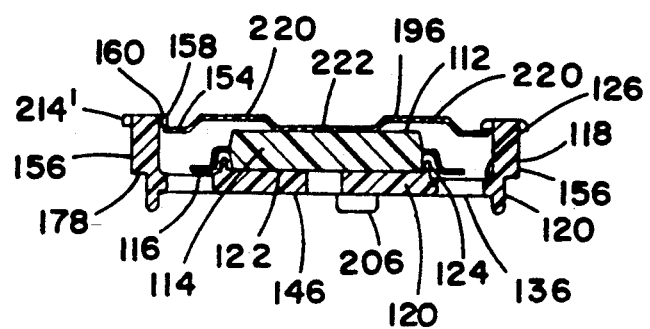
FIG. 16 is a cross-sectional side view of the carrier shown in FIG. 13 showing a component restrained by first improved edge engaging cover tape instead of the spring latch shown in FIG. 15. Background portions of the carrier have been removed for clarity purposes.

As best shown in FIGS. 14 and 16, the carrier body 118 has side members 156 which extend upward from the upper surface portion 126 of the bottom member 120 and further surround a portion of the upper surface portion 126. The side members 156 have cover tabs 158 extending generally parallel to and toward the component supporting surface 122. The cover tabs 158 each have a lower cover tab surface portion 160 facing toward the upper surface portion 126. Preferably, the carrier 110 has end members 238 on opposite sides of the upper surface portion 126 on the sides not occupied by side members 156. Optionally, test access slots 174 may be provided.

Figure 15:
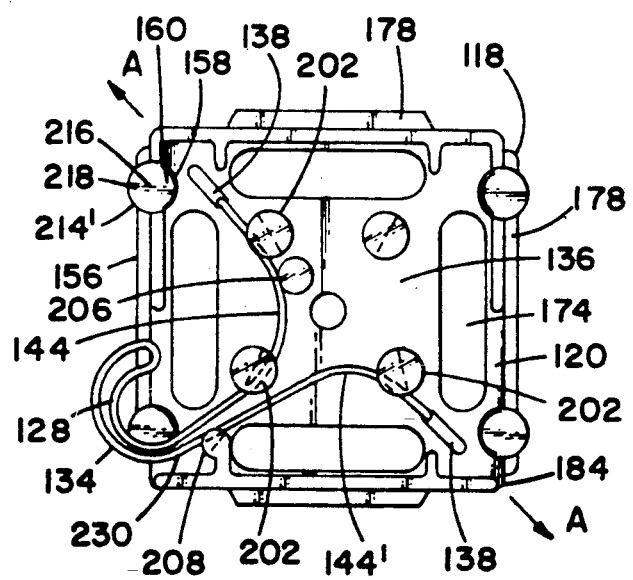
FIG. 15 is a bottom view of the carrier shown in FIG. 13 showing a first improved spring latch added to the carrier.

A first improved edge engaging cover tape 196, referred to as cover 196, is provided to cooperate with the cover tabs 158 to restrain a component in carrier body 118. Cover 196 is similar to cover 50 (individual covers) and cover tape 96 (continuous cover tape comprising a plurality of covers 50 joined together) described above. FIG. 14 and FIG. 15 show the side view and bottom view of the carrier 110 without the cover 196. FIG. 15 shows a first improved spring latch 230 added to the carrier body 118. Use of the improved spring latch 230 with the carrier 110 will be discussed in greater detail below. FIG. 16 shows a component 112 held in the carrier body 118 by the cover tape 196. It is to noted that in FIG. 16 some background features in the cross section have been omitted for clarity purposes.

As shown in FIG. 16, the cover 196 has cover edge portions 154. Each cover edge portion 154 is engagable with the lower cover tab surface portions 160 of the cover tabs 158 on side members 156 positioned on opposite sides of the bottom member 120 to restrain the cover 196 from upward movement away from the upper surface portion 126. A cover center portion, or cover contact portion 222, located generally in the central portion of the cover 196 constrains the component 112 from upward movement away from the component supporting surface 122.

The cover 196 is made of a resilient material and can be die cut or slit from plastic or thin aluminum. The cover may be supplied on a roll as a flat tape and bent into the cross-sectional shape shown in FIG. 16 by a roll forming mechanism acting as part of a cover mounting assembly process. The resilient properties of the cover 196 shown in FIG. 16 bias the cover edge portions 154 outward so that the cover edge portions 154 remain below the lower cover tab surface portions 160. Cover raised portions 220 are provided in cover 196. The cover raised portions 220 of the cover 196 are higher than the cover edge portions 154, as shown in FIG. 16. Opposing forces applied to the cover portions 154 acting parallel to the upper surface portion 126 will cause the cover raised portions 220 to bow upwards away from the upper surface portion 126. Because the cover raised portions bow upwards as the forces are applied, the cover edge portions 154 move inward, allowing the cover 196 to be mounted to the carrier side members 156 by lowering the cover 196 while the forces are being applied. After the forces are removed, the cover edge portions 154 are biased back to their original outward location with a portion below each of the lower cover tab surface portions 160 of the cover tabs 158. To remove the cover 196, forces are applied to move the cover edge portions 154 inward again and then the cover 196 is lifted upward.

FIG. 16 shows the carrier body 118 with the component 112 having a body portion 114 restrained in an area defined by the component supporting surface 122, the locator ridges 124, and the cover contact portion 222. In this position, the component body portion 114 and the fragile extending leads 116 are protected from damage during handling. Furthermore, during mounting and dismounting of the cover 196, the cover never contacts the leads of the component. The locator ridges 124 are positioned on the bottom member 120 to locate a specific component body portion. The carrier body 118 shown in FIGS. 13–16 is designed to hold a plastic quad flat pack electronic surface mount component. Improper positioning of the locator ridges, such as positioning the ridges too close together or too far apart, will prevent the component from resting completely on the component supporting surface 122.

It is to be appreciated that various other components can be restrained in the carrier body 118 other than the component 112 shown in FIG. 16. For example, components with J-leads may be used in place of component 112. In that case, the J-lead component may be mounted in one of two orientations depending upon whether or not it is permissible to contact the leads with the locator ridges 124. These two orientations are commonly referred to as live-bug and dead-bug. In addition, other components with or without extending leads may be restrained with the carrier body 110 by the restraint structure.

In bulk handling situations where several carriers 110 have fixed positions adjacent to each other in a line, several covers 196 may be joined together in a single continuous cover tape to be used to simultaneously restrain several components placed one per carrier. It is to be appreciated that the cover 196 in the present embodiment may be formed similarly to cover 96 illustrated in FIG. 11. In the case of a continuous cover 196, the same cross-sectional area, illustrated in FIG. 16, occurs throughout the cover 196. The continuous cover 196 can be mounted to and removed from multiple carriers 110 arranged in a line either simultaneously or successively by the application of opposing forces acting parallel to the component supporting surfaces 122 of the carriers. Because the cover edge portions 154 have the same shape, alignment of the cover tape 196 and carriers 110 arranged in a line is not critical. With the cover 196 having the same cross-sectional shape, an infinite number of lengthwise alignments are possible.

Figure 17:
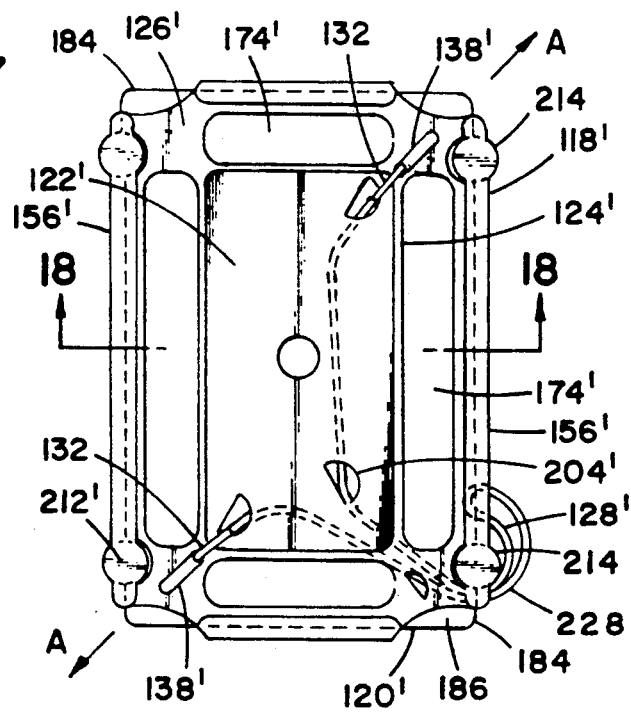
FIG. 17 is a top view of a seventh preferred embodiment of a carrier with a second improved spring latch suitable for rectangular components.
Figure 18:
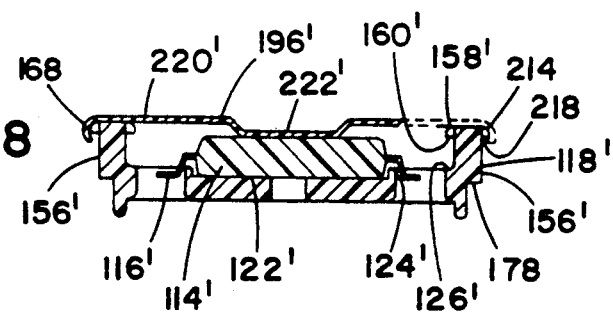
FIG. 18 is a cross-sectional side view of the carrier shown in FIG. 17 with the spring latch removed, and showing a component restrained by first improved gripper cover tape. Background portions of the carrier have been removed for clarity purposes.

FIGS. 17 and 18 show a seventh preferred embodiment of a carrier according to the principles of the present invention. The carrier shown in FIGS. 17 and 18 is similar to the carrier 110 of FIGS. 13–16 except that it is designed for holding rectangular components. The carrier shown in FIGS. 17 and 18 has elongated side members 156' on opposite sides of the upper component supporting surface 122'. Each of the side members 156' have two gripper cover tabs, or gripper tabs 214. The gripper tabs 214 each have a lower gripper surface portion 218 extending outward from the side members 156' as shown in FIG. 18.

The seventh preferred embodiment of the carrier shown in FIGS. 17–18 is elongated for rectangular components with leads on four sides. Flat upper surface portion 126' has test access slots 174' which run parallel to the edges of component supporting surface 122'. The small distance between these slots and the component supporting surface is the same thickness as the locator ridges 124 shown in FIG. 16. This thickness appears as a retaining or locator ridge 124, in FIG. 18. FIG. 18 is a cross-sectional view of the carrier shown in FIG. 17 with portions in the background omitted for clarity purposes. FIG. 17 illustrates the carrier with second improved spring latch 228 for use in restraining components. FIG. 18 shows the carrier of FIG. 18 with improved gripper cover tape 196' and without the spring latch 228. As shown in FIG. 18, flat upper surface portion 126' in this carrier contains supporting surface 122' at a slightly lower level with a perimeter shape to fit the component body perimeter.

A first improved gripper cover tape, or gripper cover 196', is shown in FIG. 18 and has a curled portion 168 along the edge of cover raised portions 220'. The curled portion surrounds the gripper tabs 214 and is engagable with lower gripper surface portions 218 of the each of the gripper tabs 214 to restrain the gripper cover 196' from upward movement away from the upper component supporting surface 122. Gripper cover 196', like cover 196, may be bent continuously from roll stock as described above for cover 196.

As shown in FIGS. 13–16 and 17–18, the carrier body side members 156, 156' have both gripper cover tabs 214,214' and cover tabs 158,158'. This permits the different covers, such as cover 196 and gripper cover 196', to be used interchangeably with the carriers. In the preferred embodiments, they are connected by lower cover boss surface 216. The cover tabs and the gripper cover tabs form the top of cover retention bosses 212,212' shown in FIGS. 13, 14, and 17. As best seen in FIGS. 13-16, each cover tab 158 and each gripper cover tab 214' are both portions of cover retention bosses 212. The cover retention bosses 212 are wider areas, preferably rounded, at the top of opposite ends of each of the side members 156. Thus, the side members 156 present a broader top surface area for stacking one component carrier on top of another. The side members 156 are tall enough to accommodate the height of the component body 114, plus any cover employed, so that carriers 110 may slide easily from a stack without interference from a carrier from above or below.

The gripper cover 196' shown in FIG. 18 is designed with a rigid but resilient material. The cover contact portion 222' biases the gripper cover raised portions 220' upward when the gripper cover curled portions 168 are bent downwards. Where several carriers have fixed positions adjacent to each other in a line, the gripper cover 196' may be provided in the form of a continuous tape with a cross section as shown in FIG. 18. The edge engaging cover tape 196 engages the cover tabs 158 on an inward side of the cover retention bosses 212, while gripper cover 196' would engage gripper cover tabs 214 on the outward side of the cover retention bosses 212 of each carrier.

To mount the gripper cover 196' to each carrier, the tape is snapped simultaneously or successively over the gripper tabs of each carrier in the series. Similarly, to remove the gripper cover from the carriers, the gripper cover is bent simultaneously or successively upward from each carrier in the series. By bending one of the free ends of the gripper cover 196' upward, the curled portions 168 on each side of the gripper cover 196' will open to snap over the gripper tabs 214 to mount the gripper cover 196' to each of the carrier bodies 118'. When the curled portion 168 snaps over the gripper tab 214, the cover contact portion 222' resists the bending moments produced as the gripper cover edge portions 154' are held down by the curled portions 168 engaging the lower gripper surface portions 218 of the gripper tabs 214. This help maintain contact between the gripper curled portions and the gripper tabs. To remove the gripper cover 196', the curled portions 168 spread outward as the gripper cover is bent upward away from the first carrier in line. Because the curled portions spread open as the gripper cover is bent upward, the gripper cover engages and disengages from the gripper tabs without having to awkwardly pry the curled portions outward away from the gripper tabs.

The gripper cover 196' may be separated into individual covers for each carrier by simply cutting the cover tape between each carrier in a series of carriers. Edge engaging cover 196 may be similarly cut. The cuts are positioned directly above each slit 89 shown in FIG. 24, and are represented by dashed lines or slits 242. Slits 242 may be made after mounting cover 196 or gripper 196' to the carriers.

FIG. 18 shows the carrier body with a gripper cover 196' restraining the component body portion 114 in an area defined by the component supporting surface 122', the locator ridges 124', and the gripper cover contact portion 222'. In this position, the component body and the extending leads are protected from damage during handling. Furthermore, during mounting and dismounting of the gripper cover 196', the gripper cover never contacts the leads 116 of the component.

Lower cover boss surfaces 216 are best seen from the side in FIG. 14 and from the bottom in FIG. 15. The lower cover boss surfaces 216 are the upper most surfaces of generally rectangular openings in the side members 156 through which the ends of locator ridges 124 are visible (see FIG. 14). These openings allow molding of the cover tabs 158 during manufacturing without having to form the difficult to mold undercuts. At the same time, they are in line with edges of the component 112, allowing inspection of the component leads 116 edgewise from outside of the carrier. These openings also permit insertion of a device for pushing the cover edge portions 154 together to mount and dismount cover 196.

As shown in FIGS. 16 and 18, the cover 196 and gripper cover 196' have center portions 222,222' contacting the component body portion 114 as the component rests on the component supporting surface 122,122' while the component is restrained. This contact produces a downward force acting to restrain the component from any upward movement. Creep may occur in the cover material because of storage time or temperature, reducing the whole downforce of the cover on a component to zero. However, the covers remain in contact with the component body and are mounted to the carrier body side members 156,156' so that as soon as the component body pushes up against the cover, it will resist with downward force on the component body. Because the carrier body restrains the cover from upward movement, it is not necessary that the cover even be designed to initially maintain a hold-down force on the component. It must merely be designed not to allow the component body portion to leave the area between the component supporting surface 122,122', the locator ridges 124,124', and the cover contact portion 222,222'.

Figure 19:
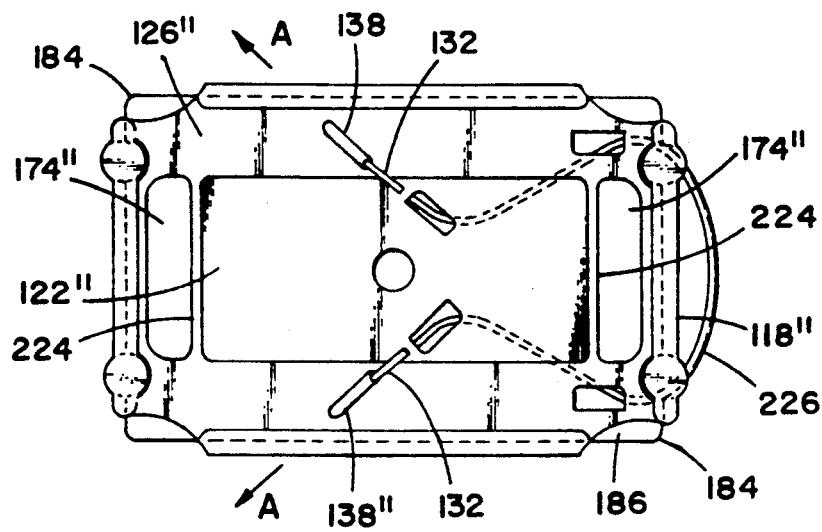
FIG. 19 is a top view of an eighth preferred embodiment of a carrier with a third improved spring latch suitable for rectangular components with leads on one or two ends of the component.

FIGS. 15, 17, and 19 show improved spring latches 230, 228, and 226 for use with carrier bodies 118,118'118". The spring latches 230, 228, and 226 each have L-shaped latch tips as described previously in the embodiments shown in FIGS. 8-10 and 12. the latch tips are represented generally as 132 in Figures illustrating the improved embodiments. For simplicity, operation of the improved spring latches will be discussed with reference to carrier 110 shown in FIGS. 13-16. The latch tips have top portions which extend generally parallel to and over a portion of the component supporting surface 122. Side portions of the tips extend generally perpendicular to and outside of the component supporting surface 122. The latch tips are movable between two positions, one where the top portions extend over the component supporting surface, called the component restrained position, and a second where they are pulled away from and parallel to the component supporting surface, called the component unrestrained position. The latch tips of each spring latch 230, 228, and 226 extend from an actuator cavity 136 through spring latch guide slots or openings 138 up to the top of the carrier through the bottom member 120. The direction of movement of the latch tips from position one to position two is in the position of the spring latch guide slots shown by arrows labelled "A" in the Figures.

Referring to the first improved spring latch 230 shown in FIG. 15, the latch tips are connected by a latch actuator 134 which has spring portion 128 that resiliently biases the latch tips toward the first position, or component restrained position. A portion of the actuator extends beyond the perimeter of the bottom member 120 when the spring latch is in the component restrained position as shown in FIG. 15. The spring latch 230 also has actuator arms 144,144' generally parallel to the component supporting surface 122 and connecting the latch tips to the end of the spring portion 128. Movement of these actuator arms causes movement of the latch tips. The spring latch 230 can be bent from a one-piece, low cost wire, making the spring latch easy and inexpensive to manufacture. The spring latch 230 may be formed from a continuous length of wire disposed on a spool or maintained in a coil wherein the spring latch is formed and cut from the continuous length.

Figure 13:
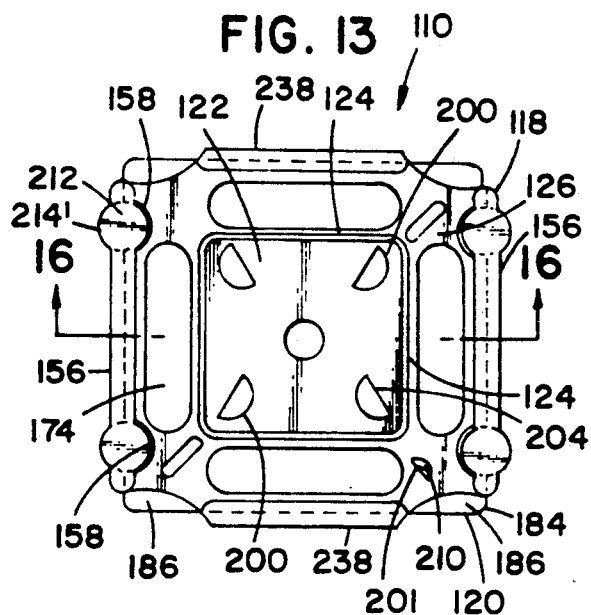
FIG. 13 is a top view of a sixth preferred embodiment of a carrier for components with square bodies showing the carrier without any restraint structure.

The bottom member 120 of the carrier body 118 has an actuator cavity 136 which lies below the upper surface portion 126. Spring latch guide slots 138 extend upward from the actuator cavity 136 to the upper surface portion 126. These guide slots are located near opposite corners of the upper surface portion 126 outside the locator ridges 124 and inside the side members 156 as shown in FIG. 13.

As shown in FIG. 15 and described previously for FIGS. 1–12, the guide slots 138 are positioned so that when the latch tips are in the component restrained position, the top portions of the latch tips extend over at least a portion of the component supporting surface 122. When the latch tips move toward the component unrestrained position, the guide slots 138 allow the top portions of latch tips to be pushed away from the component supporting surfaces in the direction indicated by arrows labelled "A" in FIG. 15.

In the preferred embodiment, the guide slots 138 are elongate shaped and are sufficiently wide to allow the latch tips to slide easily between the component restrained position and component unrestrained position. The guide slots also function as a guide for the spring latch during movement of the latch tips. It is to be appreciated that the guide slots 138 could have a wide variety of different shapes other than those depicted in the Figures.

The spring latch tips are inserted upward through the slots 138. The latch actuator 134 remains below in the actuator cavity 136 as is shown in the Figures. The spring latch is restrained from upward movement by the actuator arms 144 and 144' engaging the upper surface 146 of the actuator cavity 136.

As shown in FIGS. 13 and 16, a plurality of half circle-shaped holes 200 in the component supporting surface 122 extend downward through the bottom member and into the actuator cavity. Below the holes are a latch arm retention boss 202 with a semicircular latch retention tab 204. These engage the actuator arms 144,144' to retain the arms in close proximity to the upper surface 146 of the actuator cavity 136. The holes 200 facilitate manufacturing of the carrier without mold undercuts to form tabs 204.

The actuator cavity 136 also has a latch actuator boss 206 which extends downward from the actuator cavity upper surface 146. The side of the actuator boss 206 slidably engages the actuator arm 144 as seen in FIG. 15 to guide the spring latch 230 as it moves the latch tips toward and away from the component supporting surface. In the preferred embodiments, latch arm 144' does not engage a latch actuator boss and merely functions as a link to transmit movement from the spring portion to the latch tip. When the actuator arm 144 is pushed against the boss 206 by an external force applied to the latch actuator, the latch tips move apart. The spring latch 230, the latch actuating boss 206, and the guide slots 138 together produce equal spread of the latch tips despite input to the latch actuator that is not symmetrical to the tips.

Spring portion retention boss 208 acts as an additional guide surface for the spring latch 230 to produce equal spread of latch tips as the spring portion of the actuator slides against the boss 208. Spring portion retention boss 208 with spring portion retention tab 210 engages the spring portion 128 to retain the spring portion 128 in close proximity to the bottom member 120. Hole 201 facilitates manufacturing of the carrier without mold undercuts to form tab 210.

As described previously for the spring latch 30, 30' discussed previously, the spring latch 230 may be actuated by moving the carrier past an actuating post 94,194 positioned on a latching plate 92,192 as is illustrated in FIGS. 12, 21–22, and 24–25. It is to be noted that the spring latches in FIGS. 21–22 and 24–25 are in the component unrestrained position.

As shown in FIG. 13 and 15, test access slots 174 are provided to allow the component to be electrically tested without removing the component from the carrier body. The spring latch 230 has a spring portion 128 formed to avoid interference with the test slots 174 while biasing the latch tips to the component restrained position.

In FIG. 15, only one spring latch 230 is shown. In some circumstances, it may be useful to provide a second spring latch to restrain the component. A second spring latch could be added by inserting the latch tips of the second spring latch up through additional guide slots (not shown) provided at opposite corners of the carrier body 118. The spring portion of the second spring latch would lie in a mirror image location along a line vertical to the page on the right side of the bottom member in FIG. 15 and would similarly extend slightly past the bottom member. A second spring portion retention boss would also be added in mirror image location to the first spring retention boss 208.

A second improved spring latch 228 is shown in FIG. 17, with dotted lines indicating those portions hidden by the carrier. The spring latch 228 is similar to the spring latch 230, except it is designed to be used with the rectangular carrier shown in FIGS. 17 and 18. The spring latch 228 can replace the cover 196' shown in FIG. 18 to retain a component. The latch tips 132 extend up through the carrier body 118' through guide slots 138'. Alternatively, both the spring latch 228 and the cover 196' may be used together, with the spring latch tips 132 fitting under cover raised portions 220'.

One latch arm retention tab 204' appears in FIG. 17 at a location further inward from its adjacent corner than the retention tabs 204 shown in FIGS. 13 and 15. The tab 204' in this position retains a latch arm of the spring latch 228 and helps to deflect that arm so that its latch tip moves diagonally outward as indicated by the arrow labelled "A" at the upper right-hand corner of FIG. 17. A second spring latch and retention tabs may be added to this carrier in mirror image position as previously described for the carrier shown in FIG. 15.

FIG. 19 shows an eighth preferred embodiment of a carrier having an elongated width rather than length. The carrier contains retaining ridges 224 on only two sides of component supporting surface 122" since component leads and tests access slots 174" extend on only two sides of the components retained by this carrier. As in the embodiment shown in FIG. 17, component supporting surface 122" is slightly lower than flat upper surface portion 126". A third improved spring latch 226 contains latch tips shaped as in previous embodiments, but the latch tips 132 move in directions of the arrows labelled "A" in FIG. 19. The latch tips 132 extend up through guide slots 138" positioned on opposite sides of the upper surface portion 126".

Figure 25:
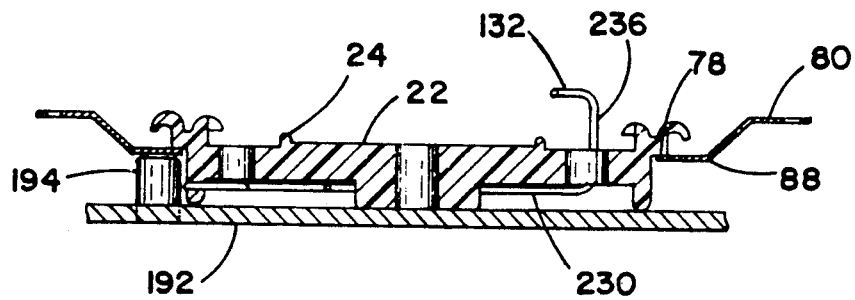
FIG. 25 is a cross-sectional side view of the carrier sheet and carrier shown in FIG. 24 without the cover tape.
Figure 24:
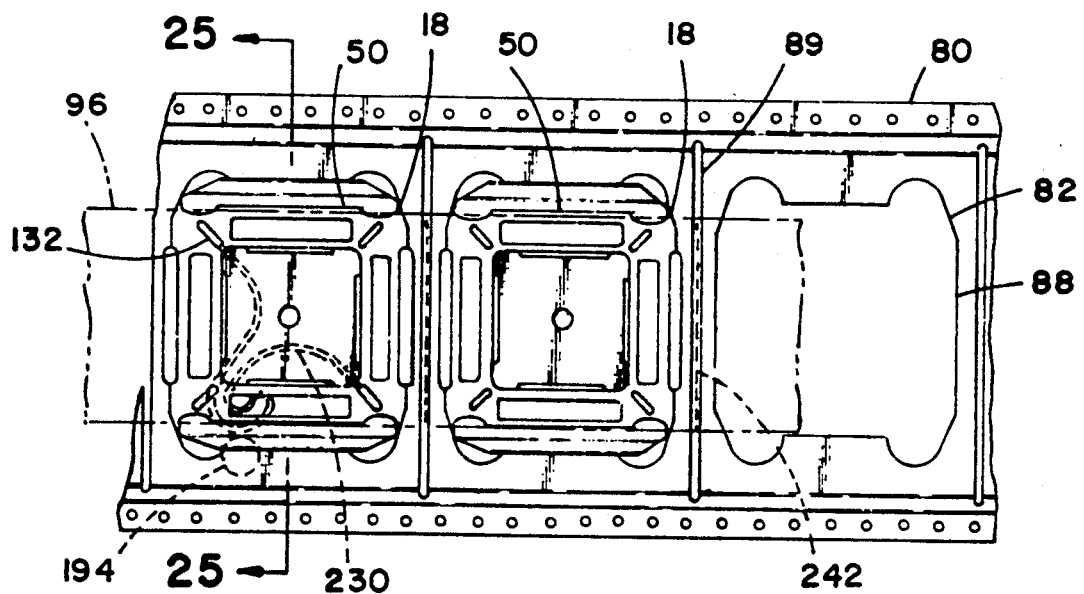
FIG. 24 is a top view of a carrier sheet with two individual carriers similar to the carrier shown in FIG. 5 and including cover tape and a spring latch. Below the carrier is a latching plate with a perpendicular latch actuating post. This view illustrates alternative positioning of the spring latch and latching post to that illustrated in FIG. 12.

FIGS. 24 and 25 show individual carriers employed for bulk handling in a single row carrier sheet 80. FIGS. 24 and 25 are similar to FIG. 11 and 12 described previously. In FIGS. 11 and 24, carrier sheet 80 has small openings along side edges for receiving sprockets of a carrier sheet handling apparatus. However, FIGS. 24 and 25 more clearly illustrate the manner which the cover tape 96 can be used simultaneously with a spring latch, such as spring latch 230. FIGS. 24 and 25 also illustrates alternative positioning of the spring latch 230 and latch actuating post 194 relative to the carrier body 18.

As shown in FIGS. 14-16 and 18 each carrier body includes at its perimeter a stop seat 178 designed to extend generally parallel to and away from the bottom member and extending beyond the perimeter of the opening in the carrier sheet 80. The stop seat 178 supports the carrier on the carrier sheet during handling by engaging the carrier sheet edge as the bottom member lowered into the opening of the carrier sheet.

The bottom member 120 also includes a plurality of body tabs 184 as shown in FIGS. 13 and 15 for carrier 110 and in the carrier in FIGS. 17 and 19. The body tabs 184 have a generally flat upper body tab surface portion 186 aligned in a plane generally parallel to and below the stop seat 178 as shown in FIG. 14. The upper body tab surface extends underneath the carrier sheet beyond the perimeter of the mounting opening of the carrier sheet when the carrier is placed into the mounting opening. The upper body tab surface is engagable with the carrier sheet so as to restrain the carrier body from upward movement away from the carrier sheet after the carrier body is inserted into the mounting opening. The interaction of the body tabs 184 from below and the stop seat 178 from above releasably locks the carrier body to the carrier sheet. As shown in FIGS. 13 and 15, the body tab surface 186 is not directly below the stop seat 178, allowing the carrier body 118 to be manufactured without difficult to mold and design undercuts.

As seen in FIGS. 13 and 14, body tab surface portions 186 are spaced between side members 156 and end members 238. They are lower than the upper surface 126 of bottom member 120, thus providing four additional openings at opposite ends of the carrier. These openings also allow edgewise inspection of component leads similar to the openings in the side members 156 noted above beneath cover retention bosses.

As described previously, the component body portion can be restrained in the area defined by the component supporting surface, the locator ridges, and either the cover contact portion of the cover or the latch tips of the spring latch. However, it may also be desirable in some instances to employ both a cover and a spring latch to restrain and protect the component during handling. The preferred embodiments of FIGS. 13-26 show either a cover (FIGS. 16, 18) or a spring latch (FIG. 15, 17, 19, 22, 25) or both (FIGS. 21, 24). If both are simultaneously employed, neither will interfere with the other because the spring latch tips fit into the chamber or space between the cover and the electronic component body provided by the cover raised portions.

Figure 20:
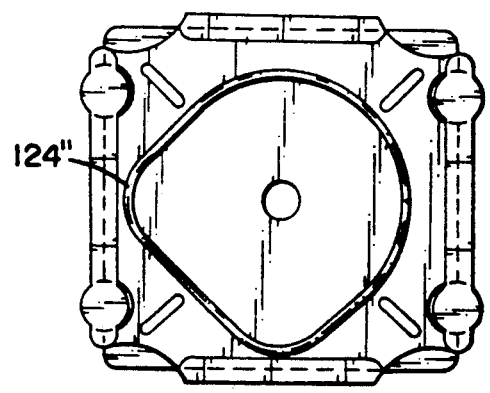
FIG. 20 is a top view of a ninth preferred embodiment of a carrier for rounded objects.
Figure 21:
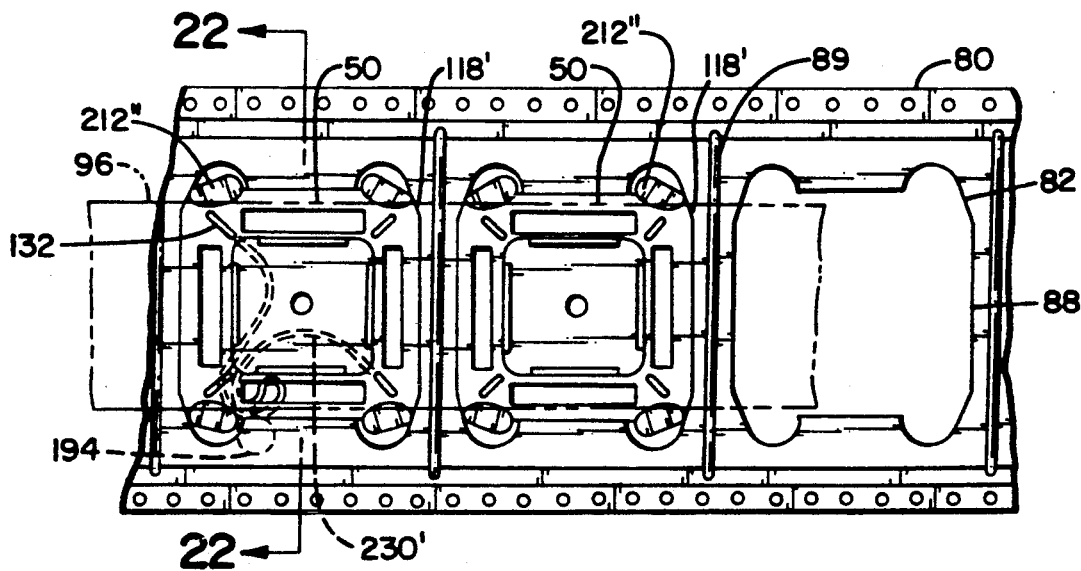
FIG. 21 is a top view of a carrier sheet illustrating how individual carriers may be combined by forming the individual carriers as carrier portions as part of the carrier sheet. The carrier sheet illustrates one carrier portion removed from the carrier sheet after being formed as part of the carrier sheet. The carrier sheet also illustrates implementation of a spring latch and cover tape simultaneously. Also illustrated is a latch actuating post placing the spring latch to the component unrestrained position.

FIG. 20 illustrates a top view of a ninth preferred embodiment of a carrier for use with rounded objects. In the carrier shown in FIG. 20, the locator ridges 124" define an irregularly shaped perimeter for a component. It is to be appreciated that the locator ridges can have a variety of different shapes to locate a wide variety of different sized and shaped components.

Figure 22:
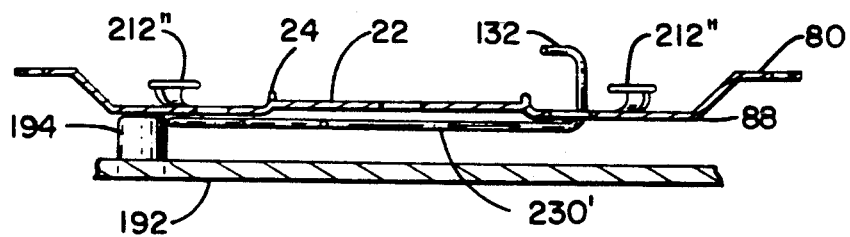
FIG. 22 is a cross-sectional side view of the carrier sheet shown in FIG. 21 showing the latching plate and latch actuating post.

FIGS. 21 and 22 show the carrier sheet 80 of FIG. 24 and FIG. 25, but containing simplified carrier bodies 118". Side members, end members, and body tabs have been eliminated, leaving only modified cover retention bosses 212" at the carrier body perimeter. The bottom surfaces of the side members and the end members previously formed a stop seat which, together with the body tabs, retained the carrier by extending past the edge of the mounting opening in the carrier sheet. Without these features, the carrier body requires some sort of other attachment structure to attach or secure the carrier body to the carrier sheet as, for example, by adhesive bonding. The carrier 118' may also be formed as an integral part of the carrier sheet, as is shown in FIGS. 21 and 22. Carrier bodies 118' are formed integrally with the carrier sheet, as carrier portions. Scored lines may be provided to follow the outline of the mounting opening which may be broken to permanently separate a carrier portion or carrier body 118' from the carrier sheet of retained components into individual carriers 118' with retained components.

The modified cover retention bosses 212' are placed in the four corners of the simplified carrier bodies 118' and provide attachment points for the same edge engaging cover 196 or gripper cover 196' as previously described. If the carrier body is formed as part of the carrier sheet, simplified cover retention bosses for use with cover 196 and gripper 196' may be produced by curling material upward and inward or outward from the rounded corners of the mounting opening to form the cover retention bosses. Spring latch retention tabs may also be formed as half circle depressions in the carrier sheet material, with the same sizes and locations as previously illustrated for the individual molded carriers.

Figure 23:
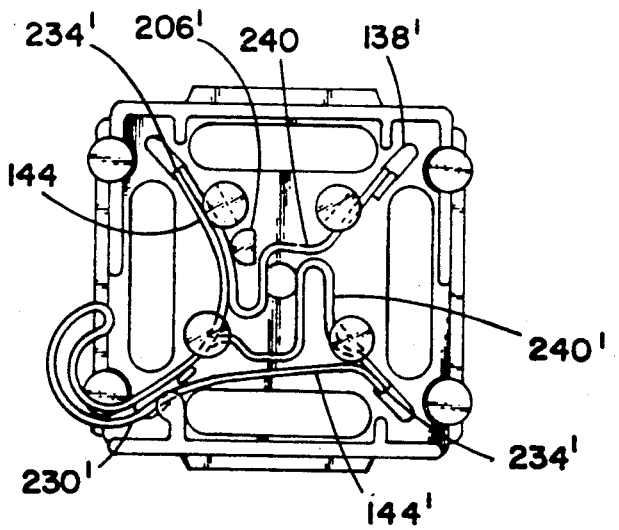
FIG. 23 is a bottom view of the carrier shown in FIG. 15 with an improved modified spring latch having two auxiliary latches.

FIG. 23 shows a carrier similar to the one shown in FIG. 15, but modified to employ an improved modified spring latch 230' with two auxiliary spring latches 240 and 240'. The carrier contains widened spring latch guide slots, 138''' at all four corners, allowing four widened latch tips to secure a component. Spring latch 230' comprises a main spring latch portion similar to spring latch 230 which is joined to auxiliary spring latch 240 at the upper left-hand corner, making a double wide latch tip. The vertical portion 234' of the latch tip enters widened guide slot 138'''. Spot welding, brazing, or similar methods may be used to fasten the two pieces of the wire together to make one tip. Similarly, at the lower right-hand corner of FIG. 23, the other end of main spring latch 230' is joined to auxiliary spring latch 240' to make another double wide latch tip. The other end of auxiliary spring latch 240' enters the guide slot at the lower left-hand corner, where it is partially hidden from view by a portion of the main spring latch which is not attached to it. A clearer view of an identical spring latch tip is seen at the upper right-hand corner, where the end of auxiliary spring latch 240 enters widened guide slot 138'''. At this corner and at the lower left-hand corner where only one spring latch enters a slot, the wire at the tip is doubled over to make a double wide latch tip to fill the slot. Modified boss 206' is provided so as to not interfere with the auxiliary spring.

Figure 26:
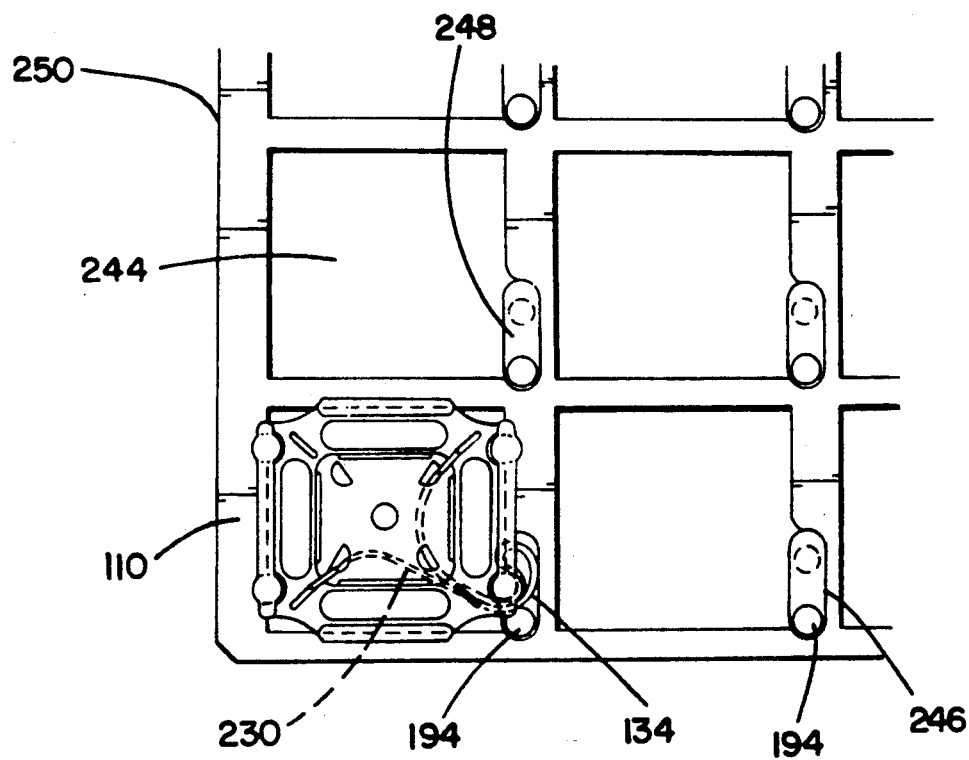
FIG. 26 is a top view of a carrier sheet matrix system for bulk handling of the carriers.

FIG. 26 shows a carrier 110 occupying one of the matrix spaces 244 in a matrix arrangement on a carrier sheet 250. A latch actuating post 194 is adjacent to each space in the matrix in a position to slidably engage the spring latch actuator 134. Actuator 134 extends from the side of carrier 110 because spring latch 230 is in the component restrained position as shown. In the preferred embodiment, the latch actuating posts 194 are attached to a common subplate 248 underneath the carrier sheet. The spring latches of all carriers 110 placed in the grid are simultaneously moved to the component unrestrained position when the subplate is moved to slide the latch actuating posts 194 forward in actuating post slots 246 through carrier sheet 250. The dash circles in FIG. 26 represent the position of the latch actuating post 194 in the component unrestrained position. The subplate may be permanently, slidably attached to a stiff carrier sheet, for example, a tray.

The invention is not to be construed as limited to the specific embodiment shown in the drawings but is to be limited only by the broad general meanings of the following claims.

We claim:

1. A carrier for use in handling and protecting electronic components which have a body portion and extending leads comprising:

a carrier body having a bottom member with a flat upper surface portion defining a smaller component supporting surface, said bottom member having a plurality of locator ridges surrounding said component supporting surface, said carrier body further having restraining means attachable to said carrier body and extending over at least a portion of said component supporting surface for holding a selected component body portion within a chamber defined by said ridges, said supporting surface and said restraining means, with the leads thereof extending over said ridges, said restraining means being discretely releasable for permitting removal of the component from said chamber when said carrier is handled in bulk with a plurality of other carriers mounted in an aligned arrangement, wherein said restraining means permits removal of the component from said carrier simultaneously with at least one component positioned in an adjacent carrier or successively relative to the other carriers handled in bulk while any remaining components are restrained by the restraining means of the remaining carriers.

2. The carrier of claim 1, wherein said restraining means includes a spring latch having two latch tips and a resilient latch actuator connecting said latch tips, said spring latch movable between a component restrained position where said latch tips extend over at least a portion of said component supporting surface and a component unrestrained position where said latch tips are positioned away from said component supporting surface, said latch actuator resiliently biasing said latch tips from said component unrestrained position to said component restrained position, said bottom member including a plurality of openings, said latch tips extending upward through said openings, and said spring latch including engaging means for engaging said bottom member to restrain upward movement thereof.

3. The carrier of claim 2, wherein said latch actuator includes a spring portion, and a pair of actuator arms extending from said spring portion parallel to said upper surface portion, said bottom member further including an actuator cavity below said upper surface portion with an upper actuator cavity surface, and said engaging means including said actuator arms engaging said upper actuator cavity surface so as to restrain said spring latch from upward movement thereof.

4. The carrier of claim 3, wherein said actuator cavity includes a latch actuating ramp extending downward having a ramp surface, said ramp surface slidably engaging at least one of said actuator arms as said spring latch moves said latch tips between said component restrained position and said component unrestrained position.

5. The carrier of claim 3, further comprising actuating means for moving said spring latch between said component restrained position and said component unrestrained position.

6. The carrier of claim 5, wherein said actuating means includes a latching post perpendicular to said bottom member, said latching post movable relative to said carrier body, said latching post engagable with said latch actuator during relative movement of said latching post and said carrier body, said latching post forcibly moving said spring latch to move said latch tips between said component restrained position and said component unrestrained position as said latching post is moved relative to said carrier.

7. The carrier of claim 6, wherein a plurality of said latching posts simultaneously engage latch actuators of a plurality of said carriers.

8. The carrier of claim 3, wherein said carrier body includes spring latch actuator retaining means for retaining latch actuator adjacent said upper actuator cavity surface.

9. The carrier of claim 8, wherein said spring latch actuator retaining means includes at least one retaining tab extending downward from said upper actuator cavity surface, said retaining tab having a retaining tab surface facing said upper actuator cavity surface and engagable with a portion of said latch actuator when said portion of said latch actuator is positioned between said retaining tab surface and said upper actuator cavity surface.

10. The carrier of claim 1, wherein said restraining means includes a cover made or resilient material having a cover center portion extending over at least a portion of said component supporting surface, said cover further including a cover edge portion, said carrier body further having a plurality of side members extending upward from said bottom member, said side members surrounding at least a portion of said upper surface portion, said side members including mounting means for mounting said cover edge portion to said side members.

11. The carrier of claim 10, wherein said mounting means includes cover tabs attached to said side members each having a lower cover tab surface portion extending above at least a portion of said cover edge portion so as to restrain said cover from upward movement thereof.

12. The carrier of claim 11, wherein said cover edge portion is biased outwardly by said cover center portion toward the position wherein said lower cover tab surface portion is above said cover edge portion when said cover edge portion is moved relative to said cover center portion away from said cover tab in a direction generally parallel to and toward said component supporting surface.

13. The carrier of claim 10, wherein said mounting means includes a gripper rail attached to said side members having a lower rail surface portion extending outward away from said side members, said cover edge portion having a curled portion surrounding said gripper rail and engagable with said lower rail surface portion so as to restrain said cover tape from upward movement thereof.

14. The carrier of claim 13, wherein said cover edge portion extends beyond said gripper rail exposing a gripping portion of said cover so as to provide a gripping surface to peel away said cover from said gripper rail.

15. The carrier of claim 13, wherein said cover center portion resiliently stretches across said component supporting surface and said curled portion resiliently grips said gripper rail to restrain said cover from upward movement thereof.

16. The carrier of claim 13, wherein said cover center portion resiliently biases said cover edge portion upward and said curled portion resiliently snaps around said gripper rail to restrain said cover from upward movement thereof.

17. The carrier of claim 10, wherein said restraining means further includes a spring latch having two latch tips and a resilient latch actuator connecting said latch tips, said spring latch movable between a component restrained position where said latch tips extend over at least a portion of said component supporting surface and a component unrestrained position where said latch tips are positioned away from said component supporting surface, said latch actuator resiliently biasing said latch tips from said component unrestrained position to said component restrained position, said bottom member including a plurality of openings, said latch tips extending upward through said openings, and said spring latch including engaging means for engaging said bottom member to restrain upward movement thereof.

18. The carrier of claim 17, wherein said cover includes a cover raised portion disposed between said cover center portion and said cover edge portion, said cover raised portion defining a chamber between said cover and said component for receiving at least one of said latch tips when said latch tips are in said component restrained position.

19. The carrier of claim 10, wherein said cover is connected to a plurality of similar covers in a line forming an elongate continuous cover, said elongate continuous cover having a cross-section in a plane transverse to said line of said covers wherein said cross-section is substantially the same along the line.

20. The carrier of claim 1, wherein said bottom member includes a plurality of test access slots extending through said bottom member, said test access slots surrounding said component supporting surface outside of said locator ridges.

21. The carrier of claim 1, wherein said bottom member includes a stop seat extending away from said bottom member, and a carrier sheet having a mounting opening therein sized to accommodate said carrier, said stop seat being engagable with an edge of said carrier sheet mounting opening so as to support said carrier on said carrier sheet during handling of said carrier.

22. The carrier of claim 21, wherein said bottom member includes a body tab having an upper body tab surface portion located below said stop seat, said upper body tab surface portion engagable with said edge of said carrier sheet so as to restrain said carrier from upward movement away from said carrier sheet during handling of said carrier.

23. The carrier of claim 22, wherein said body tab includes an inclined side surface portion extending downward and away from said upper body tab surface toward said bottom member, said inclined side surface portion slidably engaging said carrier sheet edge as said carrier is mounted in said mounting opening so as to deflect said carrier sheet edge outward until said carrier sheet edge flexes back between said upper body tab surface portion and said stop seat.

24. The carrier of claim 21, wherein said carrier sheet includes a plurality of mounting openings therein, said mounting openings positioned linearly in said carrier sheet, and said carrier sheet further including an elongated slit between each of said mounting openings perpendicular to the line formed by said mounting openings, said slits being longer than said mounting openings, whereby said carrier sheet portions adjacent to said slits bend as said carrier sheet is formed to a circular shape.

25. The carrier of claim 1, wherein said locator ridges and said component supporting surface define a substantially rectangular area.

26. The carrier of claim 1, wherein said locator ridges and said component supporting surface define a substantially square area.

27. The carrier of claim 1, wherein said bottom member of said carrier body is formed integrally with a carrier sheet having sprocket-engaging edge portions.

28. A carrier for use in handling electronic components which have a body portion comprising:
a carrier body having a bottom member with an upper surface portion defining a smaller component supporting surface, said bottom member having a plurality of locator ridges surrounding at least a portion of said component supporting surface, said carrier body further having restraining means mountable thereon so as to extend over at least a portion of said component supporting surface to hold a selected component body portion within a chamber defined by said ridges, said supporting surface and said restraining means, said restraining means including at least one latch tip movable in a direction generally parallel to said component supporting surface between a component restrained position wherein said latch tip extends over at least a portion of said component supporting surface and a component unrestrained position wherein said latch tip is positioned away from said component supporting surface.

29. A carrier for use in handling and protecting electronic components which have a body portion comprising:
a carrier body having a bottom member with an upper surface portion defining a smaller component supporting surface, said bottom member having a plurality of locator ridges surrounding at least a portion of said component supporting surface, said carrier body further having restraining means mountable thereon so as to extend over at least a portion of said component supporting surface to hold a selected component body portion within a chamber defined by said ribs, said supporting surface and said restraining means, said restraining means including a cover made of resilient material having a cover center portion extending over at least a portion of said component supporting surface, said cover further including a cover edge portion, said carrier body further having a plurality of side members extending upward from said bottom member, said side members surrounding at least a portion of said upper surface portion, said side members including mounting means for mounting said cover edge portion to said side members, said mounting means including at least one gripper receiving member attached to one of said side members with said gripper receiving member having a lower surface portion extending outward away from said side member in a direction away from said component supporting surface, said cover edge portion having a curled portion surrounding said gripper receiving member and engagable with said lower surface portion so as to restrain said cover from upward movement away from said component supporting surface, said cover center portion resiliently biasing said cover edge portion upward when said curled portion surrounds said gripper receiving member.

30. The carrier of claim 29 wherein at least one of said side members contains an opening through said side member, said opening being disposed between said gripper receiving member and said upper surface portion, said opening permitting viewing of the component in said chamber.

31. A carrier for use in handling and protecting electronic components which have a body portion, comprising:
- a plurality of carrier bodies each having a bottom member with an upper surface portion defining a smaller component supporting surface, said bottom member having a plurality of locator ridges surrounding at least a portion of said component support surface;
- means for attaching the plurality of carrier bodies in an aligned arrangement;
- restraining means mountable to each of the carrier bodies so as to extend over at least a portion of said component supporting surface of each carrier body to hold a selected component body portion in each carrier body within a chamber defined by said ridges, said supporting surface and said restraining means, said restraining means including a continuous cover of continuous cross-section in the alignment direction and made of resilient material, said cover having a cover center portion extending over at least a portion of said component supporting surface of each carrier body, said cover further including two cover edge portions extending from the cover center portion;
- each of said carrier bodies further having at least two opposing side members protruding from said carrier body, said side members surrounding at least a portion of said upper surface portion, said side members including mounting means for mounting said cover edge portions to each of said side members, said side members of each carrier body being separated by spaces from side members of adjacent carrier bodies.

* * * * *

UNITED STATES PATENT AND TRADEMARK OFFICE
CERTIFICATE OF CORRECTION

PATENT NO. : 5,101,975　　　　　　　　　　　　　Page 1 of 2

DATED : April 7, 1992

INVENTOR(S) : Runyon et al.

It is certified that error appears in the above-identified patent and that said Letters Patent is hereby corrected as shown below:

```
Column 2, line 41
     DELETE "retrained" and INSERT therefor
        --restrained--.

Column 3, line 54
     DELETE "8" and INSERT therefor --18--.

Column 11, line 2
     INSERT --be-- after the word "to".

Column 12, line 42
     DELETE "124" and INSERT therefor --124'--.

Column 12, line 58
     DELETE "the" after the word "of".

Column 12, line 61
     DELETE "122" and INSERT therefor --122'--.

Column 13, line 45
     DELETE "help maintain" and INSERT therefor
        --helps to maintain--.

Column 15, line 50
     DELETE "16" and INSERT therefor --15--.

Column 16, line 18
     DELETE "discussed previously" after the numeral
        "30'".

Column 16, line 24
     DELETE "Fig." and INSERT therefor --Figs.--.
```

UNITED STATES PATENT AND TRADEMARK OFFICE
CERTIFICATE OF CORRECTION

PATENT NO.  :   5,101,975
DATED       :   April 7, 1992
INVENTOR(S) :   Runyon et al.

It is certified that error appears in the above-identified patent and that said Letters Patent is hereby corrected as shown below:

```
Column 18, line 13
     DELETE "118"" and INSERT therefor --118'--.

Column 18, line 32
     DELETE "212'" and INSERT therefor --212"--.

Column 20, line 36
     INSERT "said" after the word "retaining".

Column 24, claim 31, lines 8 and 9
     DELETE "support" and INSERT therefor
        --supporting--.
```

Signed and Sealed this

Thirty-first Day of August, 1993

BRUCE LEHMAN

*Attest:*

*Attesting Officer*          *Commissioner of Patents and Trademarks*